United States Patent
Wang

(10) Patent No.: US 8,389,371 B2
(45) Date of Patent: Mar. 5, 2013

(54) METHOD OF FABRICATING INTEGRATED CIRCUIT DEVICE, INCLUDING REMOVING AT LEAST A PORTION OF A SPACER

(75) Inventor: Shiang-Bau Wang, Pingzchen (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 36 days.

(21) Appl. No.: 12/827,936

(22) Filed: Jun. 30, 2010

(65) Prior Publication Data

US 2012/0003806 A1    Jan. 5, 2012

(51) Int. Cl.
*H01L 21/336* (2006.01)

(52) U.S. Cl. ........ 438/305; 438/303; 438/199; 438/283; 438/591; 257/390; 257/900; 257/E21.626; 257/E21.64

(58) Field of Classification Search .................. 438/299, 438/303, 199, 275, 278, 230, 652, 283, 573, 438/216, 926, 585, 591, 306, 297, 305, 302, 438/231, 232; 257/E21.632, E21.626, E21.64, 257/413, 346, 900, 390, 324, 202, 204

See application file for complete search history.

(56) References Cited

U.S. PATENT DOCUMENTS

| | | | |
|---|---|---|---|
| 7,226,820 B2 * | 6/2007 | Zhang et al. | 438/149 |
| 7,378,305 B2 * | 5/2008 | Hatada et al. | 438/153 |
| 2007/0200185 A1 * | 8/2007 | Hirase et al. | 257/410 |
| 2009/0057769 A1 * | 3/2009 | Wei et al. | 257/369 |
| 2010/0059833 A1 * | 3/2010 | Yu et al. | 257/410 |

* cited by examiner

*Primary Examiner* — Ha Tran T Nguyen
*Assistant Examiner* — Thanh Y Tran
(74) *Attorney, Agent, or Firm* — Lowe Hauptman Ham & Berner, LLP

(57) ABSTRACT

A method for fabricating an integrated device is disclosed. A sacrificial gate stack is provided with a line width narrower than the target width of the final gate structure. After performing a tilt-angle implantation process, L-shape spacers are formed over the sidewalls of the sacrificial gate stack, and offset spacers are formed over the sidewalls of the L-shape spacers. An insulating layer is formed over the offset spacers and the substrate. Then, the sacrificial gate stack and the L-shape spacers are removed to form a trench in the insulating layer. A metal gate is then filled in the trench to form the final gate structure.

20 Claims, 12 Drawing Sheets

METHOD OF FABRICATING INTEGRATED CIRCUIT DEVICE, INCLUDING REMOVING AT LEAST A PORTION OF A SPACER

RELATED APPLICATION

The present disclosure is related to the following commonly-assigned U.S. patent applications, the entire disclosures of which are incorporated herein by reference: U.S. application Ser. No. 12/686,866 for "MULTI-LAYER HARD MASK".

BACKGROUND

The present disclosure relates generally to an integrated circuit (IC) device and, more particularly, to a method for forming a gate structure.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed a "gate last" process in which the final gate stack is fabricated "last," which allows for reduced number of subsequent processes that must be performed after formation of the gate, including high temperature processing. Additionally, as the dimensions of transistors decrease, the thickness of the gate oxide must be reduced to maintain performance with the decreased gate length. In order to reduce gate leakage, high dielectric constant (high-k) gate insulator layers are also used, which allow greater physical thicknesses while maintaining the same effective thickness as would be provided by a typical gate oxide used in larger technology nodes.

There are challenges to implement such features and processes in CMOS fabrication. As technology nodes continue to decrease, particularly to 22-nanometer technology nodes and beyond, the spacing between gate stacks continues to decrease. A high aspect ratio results when the spacing between gate stacks is decreased. The high aspect ratio will cause shadowing effects when forming pocket/lightly doped source/drain (LDD) regions by using tilt-angle implanting processes. Hence, it will affect the pocket/LDD formation process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
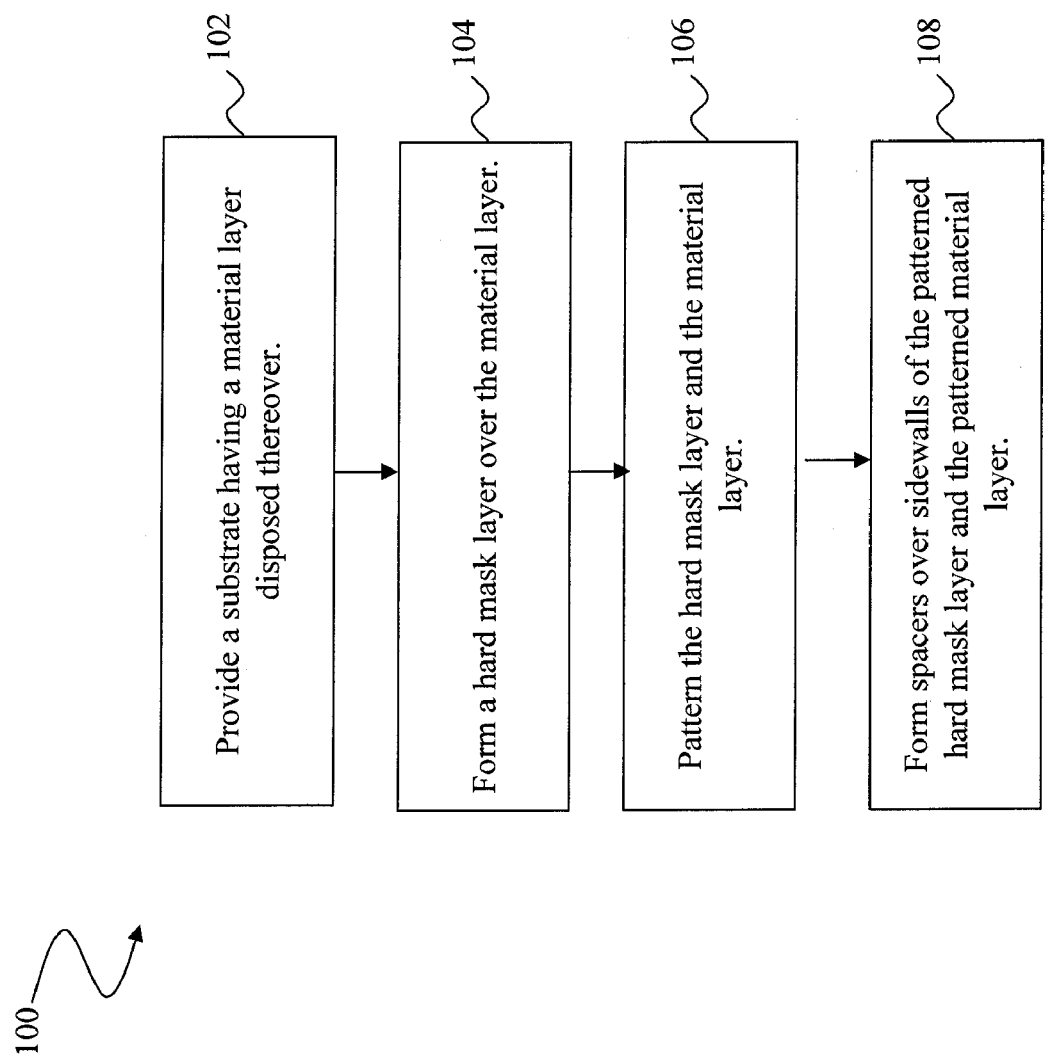
FIG. 1 is a flow chart of a method for fabricating an integrated circuit device according to aspects of the present disclosure.

The present disclosure relates generally to methods for manufacturing integrated circuit devices, and more particularly, to gate stacks utilized for manufacturing integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-12, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
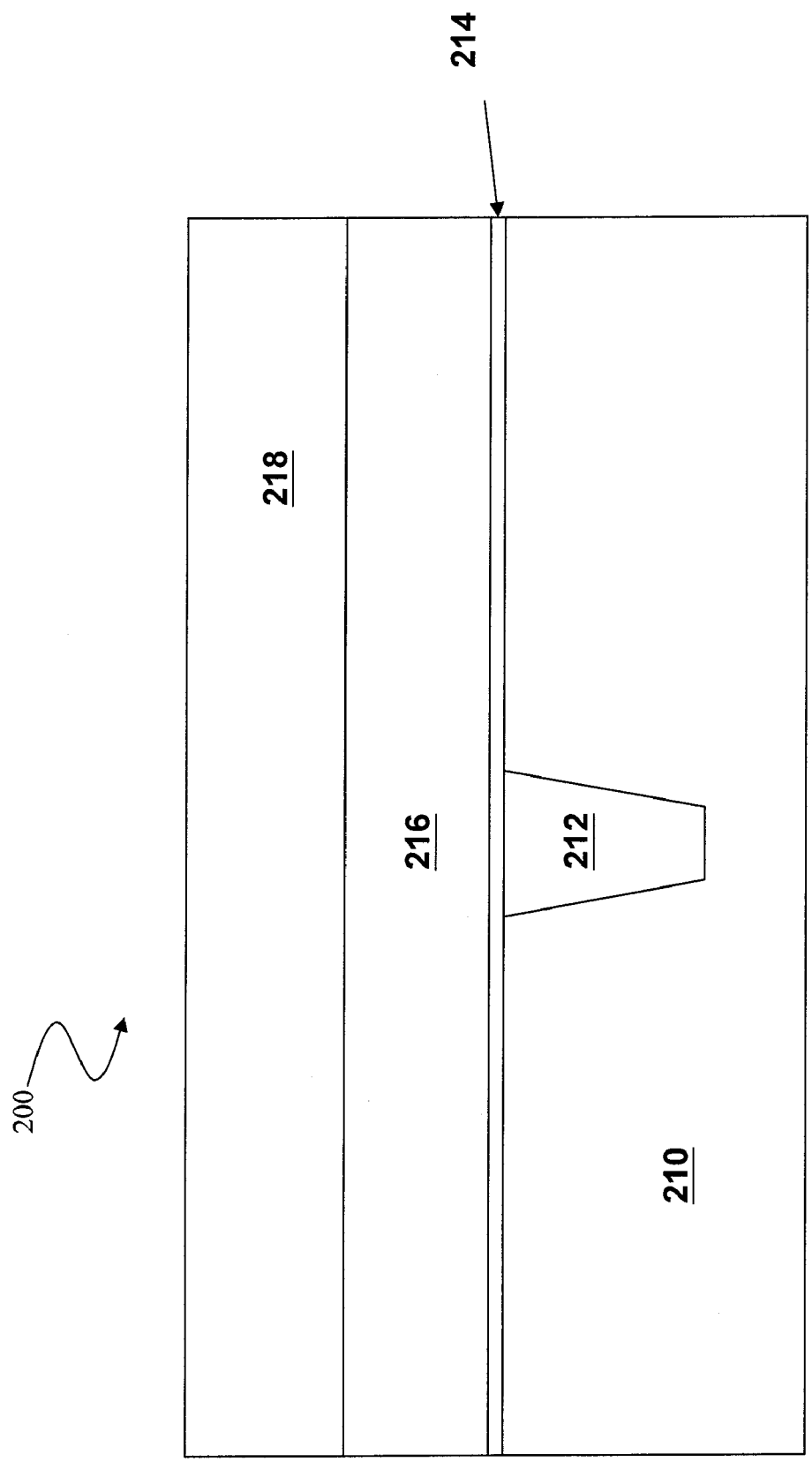
FIGS. 2-12 are various cross-sectional views of embodiments of an integrated circuit device during various fabrication stages according to the method of FIG. 1.

Referring to FIGS. 1 and 2, the method 100 begins at a step 102, wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by CMOS technology processing, and thus some processes are not described in detail herein.

An exemplary isolation region 212 is formed in the substrate 210 to isolate various regions of the substrate 210, and in the present embodiment, to isolate the NMOS and PMOS device regions. The isolation region 212 utilizes isolation technology, such as local oxidation of silicon (LOCOS) or shallow trench isolation (STI), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition (CVD) process) with one or more dielectric materials. In some examples, the filled trench may have a multi-layer structure such as a thermal oxide liner layer filled with silicon nitride or silicon oxide.

A material layer is formed over the substrate 210. The material layer includes one or more material layers comprising any suitable material and thickness. The material layer can include interfacial layers, capping layers, diffusion/barrier layers, dielectric layers, high-k dielectric layers, conductive layers, gate layers, liner layers, seed layers, adhesion layers, other suitable layers, and/or combinations thereof. The material layer is formed by any suitable process including CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The semiconductor device 200 may include one or more antireflective coating layers, such as a top antireflective coating layer and/or a bottom antireflective coating layer.

In one embodiment, the material layer includes a gate dielectric layer 214 and a gate electrode layer 216. The gate dielectric layer 214 is formed over the substrate 210 by any suitable process to any suitable thickness. The gate dielectric layer 214, for example, is silicon oxide, silicon oxynitride, silicon nitride, spin-on glass (SOG), fluorinated silica glass (FSG), carbon doped silicon oxide, Black Diamond® (Applied Materials of Santa Clara, Calif.), xerogel, aerogel, amorphous fluorinated carbon, Parlyene, BCB (bis-benzocyclobutenes), SiLK™ (Dow Chemical, Midland, Mich.), polyimide, other suitable dielectric materials, or combinations thereof. The gate dielectric layer 214 may comprise a high-k dielectric material, such as $HfO_2$, HfSiO, HfSiON, HfTaO, HfSiO, HfZrO, other suitable high-k dielectric materials, and/or combinations thereof. The gate dielectric layer 214 can further include an interfacial layer, which comprises a grown silicon oxide layer (e.g., thermal oxide or chemical oxide) or silicon oxynitride (SiON).

The gate electrode layer 216 is formed over the gate dielectric layer 214 by any suitable process to any suitable thickness. In the present embodiment, the gate electrode layer 216 is a polysilicon layer. The polysilicon (or poly) layer is formed by CVD or other suitable deposition process. For example, silane ($SiH_4$) may be used as a chemical gas in the CVD process to form the gate electrode layer 216. The gate electrode layer 216 may include a thickness ranging from about 400 to about 800 angstrom (Å). In some embodiments, the gate electrode layer 216 and/or the gate dielectric layer 214 are sacrificial layers and will be removed by a replacement step after a gate patterning process.

Still referring to FIGS. 1 and 2, the method 100 proceeds to a step 104 wherein a hard mask layer 218 is formed over the gate electrode layer 216 by any suitable process to any suitable thickness. The hard mask layer 218, in one embodiment, includes silicon oxide. The hard mask layer 218, in another embodiment, may include silicon nitride (SiN), silicon oxynitride (SiON), silicon carbide (SiC), SiOC, spin-on glass (SOG), a low-k film, tetraethylorthosilicate (TEOS), plasma enhanced CVD oxide (PE-oxide), a high-aspect-ratio-process (HARP)-formed oxide, amorphous carbon material, other suitable materials, and/or combinations thereof. The silicon oxide layer may be formed using methods such as CVD, PVD, or ALD and may have a thickness ranging from about 300 Å to about 800 Å.

Figure 3:
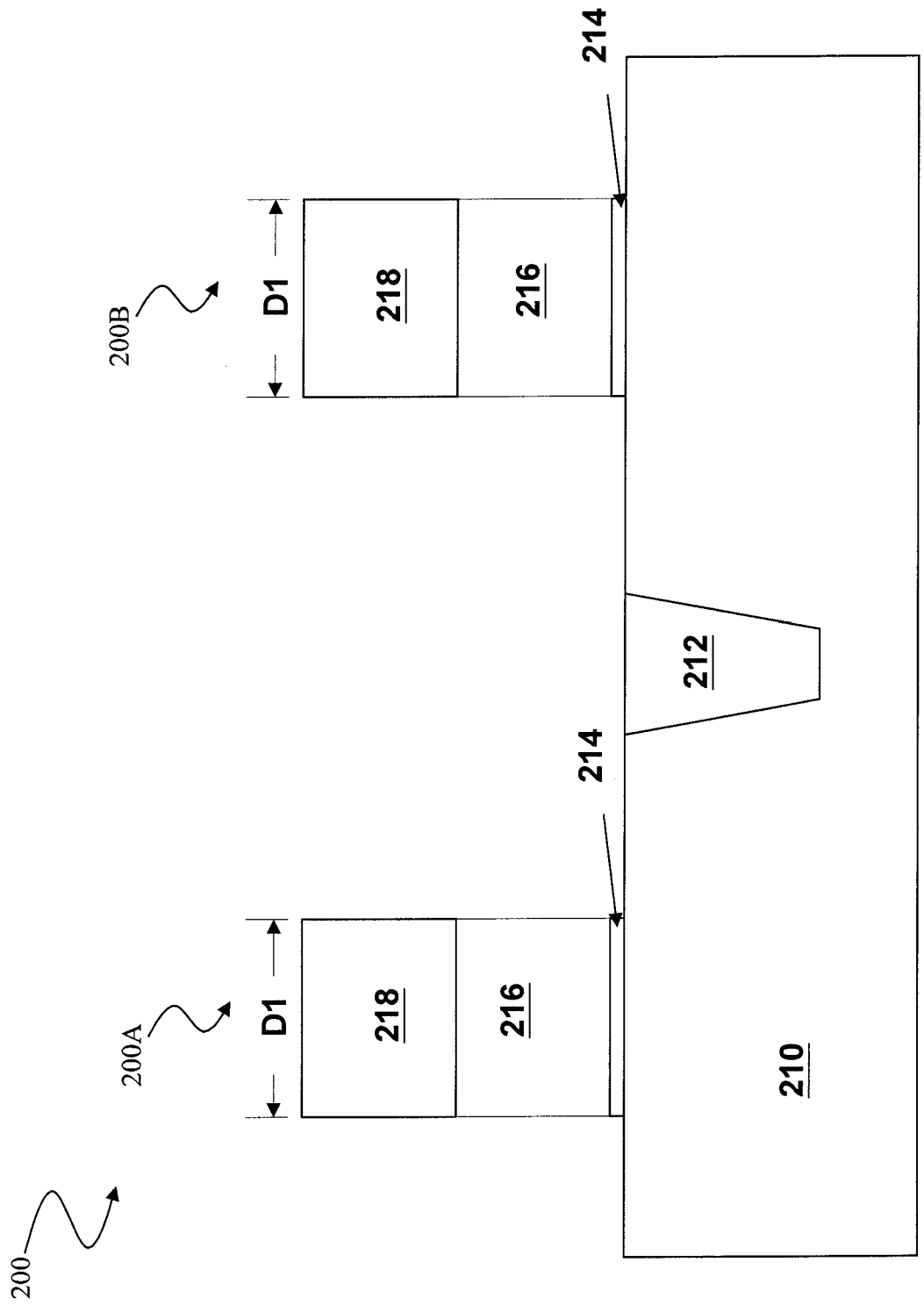

Referring to FIGS. 1 and 3, the method 100 continues with a step 106 in which a patterning process is applied to the hard mask layer 218, the gate electrode layer 216, and the gate dielectric layer 214 to form gate structures for a PMOS device 200A and a NMOS device 200B over the substrate 210. Each gate structure comprises a gate dielectric 214 and a gate electrode 216, and has a hard mask 218 formed thereon. The patterning process, for example, may include forming a layer of photoresist (not shown) over the hard mask layer 218 by a suitable process, such as spin-on coating, and then exposing and developing the layer of photoresist to form a photoresist feature. The photoresist feature can be transferred to the underlying gate dielectric layer 214, the gate electrode layer 216, and the hard mask layer 218 to form the gate structures by a dry etching process. The gate structures are designed to have a line width D1 narrower than a target width D (shown in FIG. 7) of the final gate structures. In some embodiments, the line width D1 is less than D by about 20 Å to about 100 Å. Additionally, an anti-reflective coating (ARC) layer (not shown) may be formed on the hard mask layer 218 and under the layer of photoresist to enhance a subsequent patterning process. The photolithography patterning processes may include soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Then, an etching process, including dry etching, wet etching, and/or other etching methods (e.g., reactive ion etching) is provided to from the gate structures for the PMOS device 200A and the NMOS device 200B. The photoresist layer may be stripped thereafter. It is understood that the above examples do not limit the processing steps that may be utilized to form the gate structures.

Recesses (not shown) may be optionally formed on each side of the gate structure of NMOS device 200B in the substrate 210 after the formation of the gate structure. There are not recesses formed around the PMOS device 200A at the same time by covering a protector (not shown), e.g., a photoresist pattern, thereon while the NMOS device 200B is exposed. The recesses may be formed by any suitable process and are substantially aligned with edges of the gate structure of NMOS device 200B. The recesses may be formed by a selective etching process, which can include one or more wet etching and/or dry etching processes. Thereafter, the protector may be removed by a stripping process. N-type strained source/drain (NSSD) regions (not shown) are then formed by any suitable process over the recesses. In one embodiment, the NSSD regions are formed by one or more epitaxial growth processes to any suitable thickness. The epitaxial process may include CVD deposition techniques (e.g., vapor-phase epitaxy (VPE) and/or ultra-high vacuum CVD (UHV-CVD)), molecular beam epitaxy (MBE), and/or other suitable processes. The epitaxial process may use gaseous and/or liquid precursors, which may interact with the composition of the substrate 210. The NSSD regions comprise any suitable material, such as epitaxially grown silicon, SiC, and/or combinations thereof. A cleaning process may be subsequently performed, such as cleaning process utilizing a DHF cleaning solution.

Figure 4:
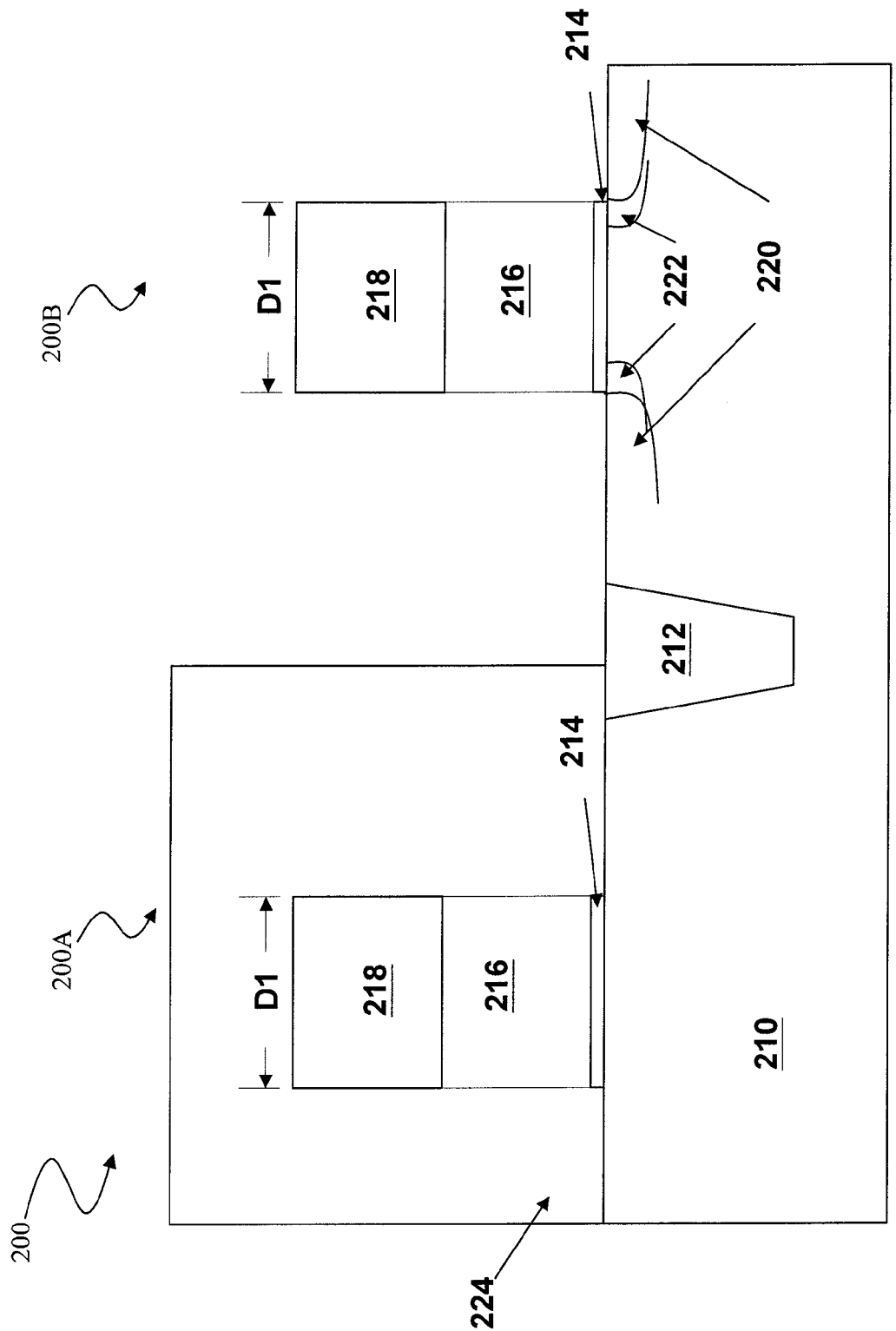

Referring to FIG. 4, various implantation processes are provided to form various doped regions in the NMOS device 200B. There are not doped regions formed around the PMOS device 200A at this time by covering a protector 224, e.g., a photoresist pattern, thereon. The doped regions may comprise various doping profiles and may be formed by a plurality of implantation processes. In one embodiment, N-type lightly doped source/drain (NLDD) regions 220 may be formed in the substrate by one or more ion implantation processes. The NLDD regions 220 are substantially aligned with edges of the gate structure of NMOS device 200B. In another embodiment, P-type pocket regions 222 may be formed adjacent to the NSSD regions and under the edges of the gate structure of NMOS device 200B by one or more ion implantation processes. The implantation for forming the NLDD/P-type pocket regions 220/222 may employ tilt angle processes by any suitable angles. In one embodiment, approximately 25° to about 30° of tilt angle is utilized. Thereafter, the protector 224 is removed by a stripping process. The tilt-angle implantation may be subject to shadowing side effects because of the high aspect ratio between the gate structures. As noted above, the instant gate structure has the line width D1 narrower than the target width D of the final gate structure. Therefore, the spacing between the gate structures is increased and the aspect ratio is decreased. The shadowing effects are effectively improved during formation of the NLDD/P-type pocket regions 220/222.

Subsequently, recesses (not shown) may be formed on each side of the gate structure of PMOS device 200A in the substrate 210. A protector (shown in FIG. 5), e.g., photoresist pattern, may be formed overlying the NMOS device 200B while the PMOS device 200A is exposed. The recesses are formed on each side of the gate structure of PMOS device 200A by any suitable process, and are substantially aligned with edges of the gate structure of PMOS device 200A. The recesses may be formed by a selective etching process, which can include one or more wet etching and/or dry etching processes. Then, the protector can be removed by a stripping process. P-type strained source/drain (PSSD) regions (not shown) may be formed by any suitable process over the recesses. In one embodiment, the PSSD regions are formed by one or more epitaxial growth processes to any suitable thickness. The epitaxial process may include CVD deposition techniques (e.g., VPE and/UHV-CVD), MBE, and/or other suitable processes. The epitaxial process may use gaseous and/or liquid precursors, which may interact with the composition of the substrate 210. The PSSD regions comprise any suitable material, such as epitaxially grown SiGe. A cleaning process may be subsequently performed, such as cleaning process utilizing a DHF cleaning solution.

Figure 5:
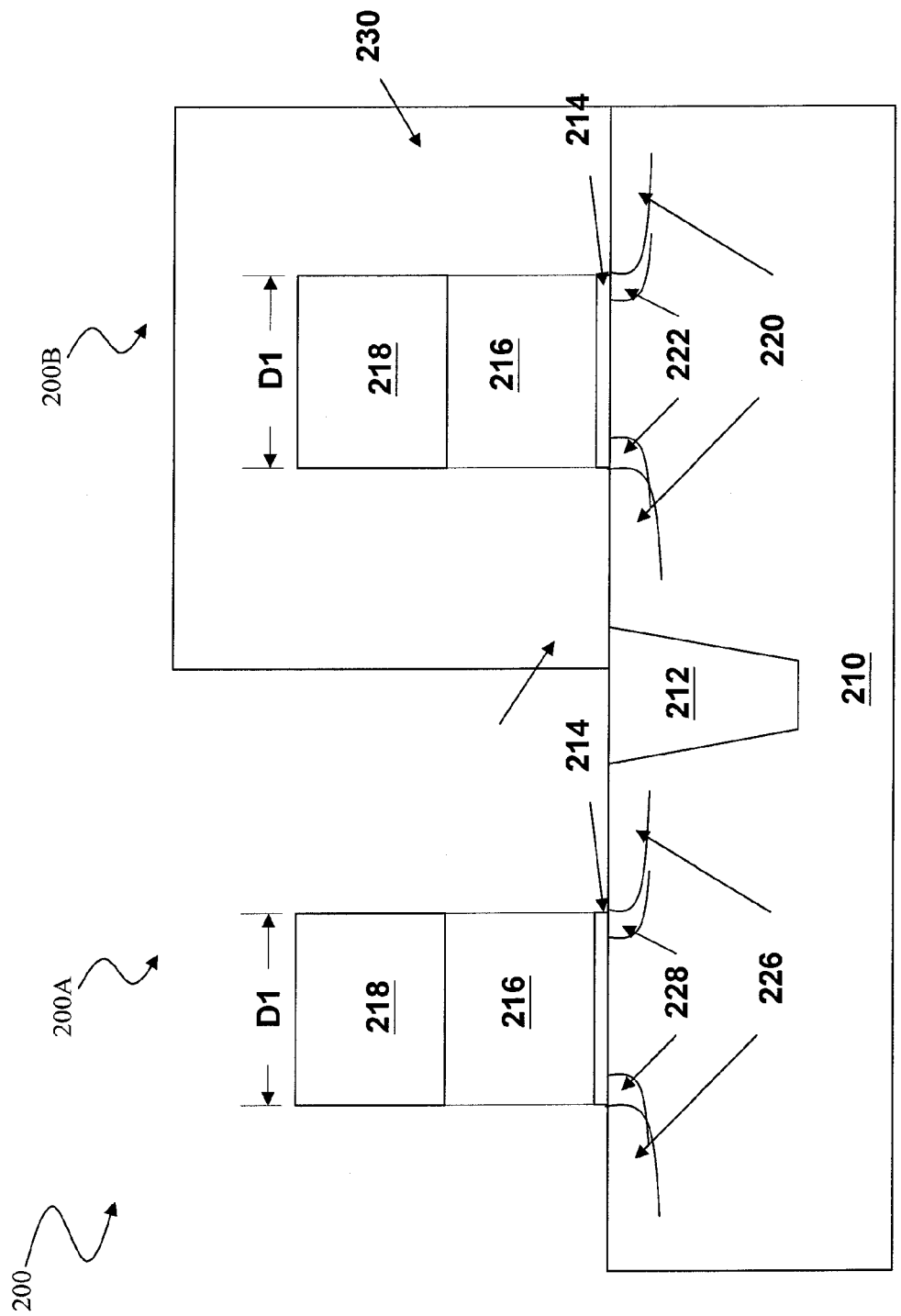

Referring to FIG. 5, various implantation processes are provided to form various doped regions in the PMOS device 200A. There are not doped regions formed around the NMOS device 200B at this time by covering a protector 230, e.g., a photoresist pattern, thereon. The doped regions may comprise various doping profiles and may be formed by a plurality of implantation processes. In one embodiment, P-type lightly doped source/drain (PLDD) regions 226 may be formed in substrate 210 by one or more ion implantation processes. The PLDD regions 226 are substantially aligned with the edges of the gate structure of PMOS device 200A. In another embodiment, N-type pocket regions 228 may be formed adjacent to the PSSD regions and under the edges of the gate structure of PMOS device 200A by one or more ion implantation processes. The implantation for forming the PLDD/N-type pocket regions 226/228 may employ tilt-angle processes by any suitable angles. In one embodiment, the angles for forming the PLDD/N-type pocket regions 226/228 are similar to the angles for forming the NLDD/P-type pocket regions 220/222. In another embodiment, approximately about 25° to about 30° of tilt angle is utilized. Thereafter, the protector 230 is removed by a stripping process. The tilt-angle implantation may be subject to shadowing side effects because of the high aspect ratio resulted from the narrow spacing between the gate structures. As noted above, the instant gate structure has the line width D1 narrower than the target width D of the final gate structure. Therefore, the spacing between the gate structures is increased and the aspect ratio is decreased. The shadowing effects are effectively improved during the formation of the NLDD/P-type pocket regions 226/228.

Figure 6:
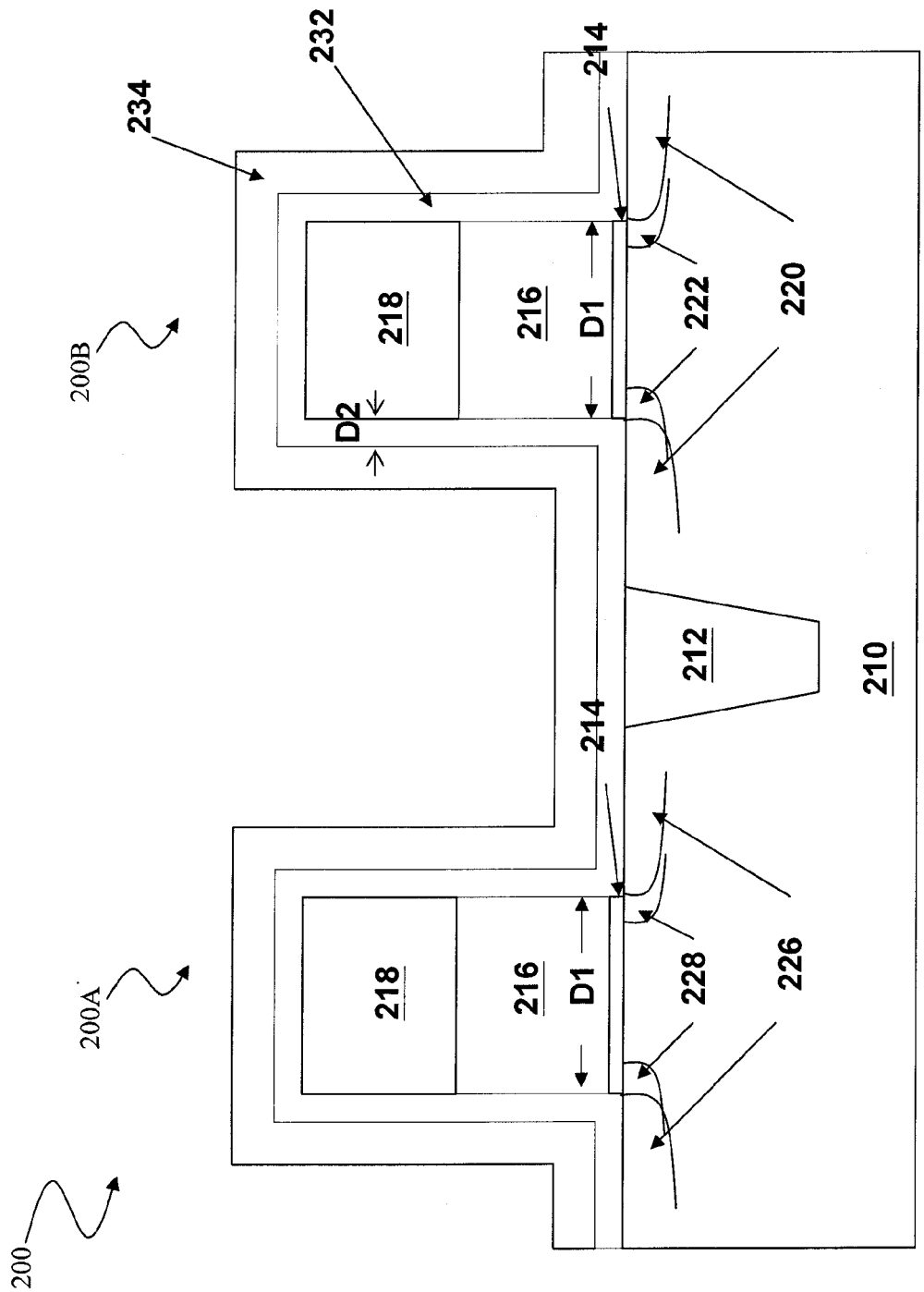

Referring to FIG. 6, a spacer layer 232 is formed over the gate structures of PMOS/NMOS devices 200A/200B and the substrate 210. Thereafter, an offset spacer layer 234 is formed over the spacer layer 232. In one embodiment, the spacer layer 232 comprises a material different from the material of the offset spacer layer 234. In another embodiment, the spacer layer 232 comprises a material same as to the gate dielectric layer 214. In other embodiment, the spacer layer 232 is silicon oxide. The spacer layer 232 may have a thickness D2. In one embodiment, the thickness D2 is ranging between about 10 Å and about 50 Å. The offset spacer layer 234 comprises, for example, silicon nitride, silicon carbide, silicon oxynitride, silicon nitride carbide, other suitable materials, and/or combinations thereof. The thickness of the offset spacer layer 234 ranges from 40 Å to about 300 Å. The spacer layer 232 and the offset spacer layer 234 may be formed by using techniques, such as PECVD, LPCVD, sub-atmospheric chemical vapor deposition (SACVD), ALD, and the like.

Figure 7:
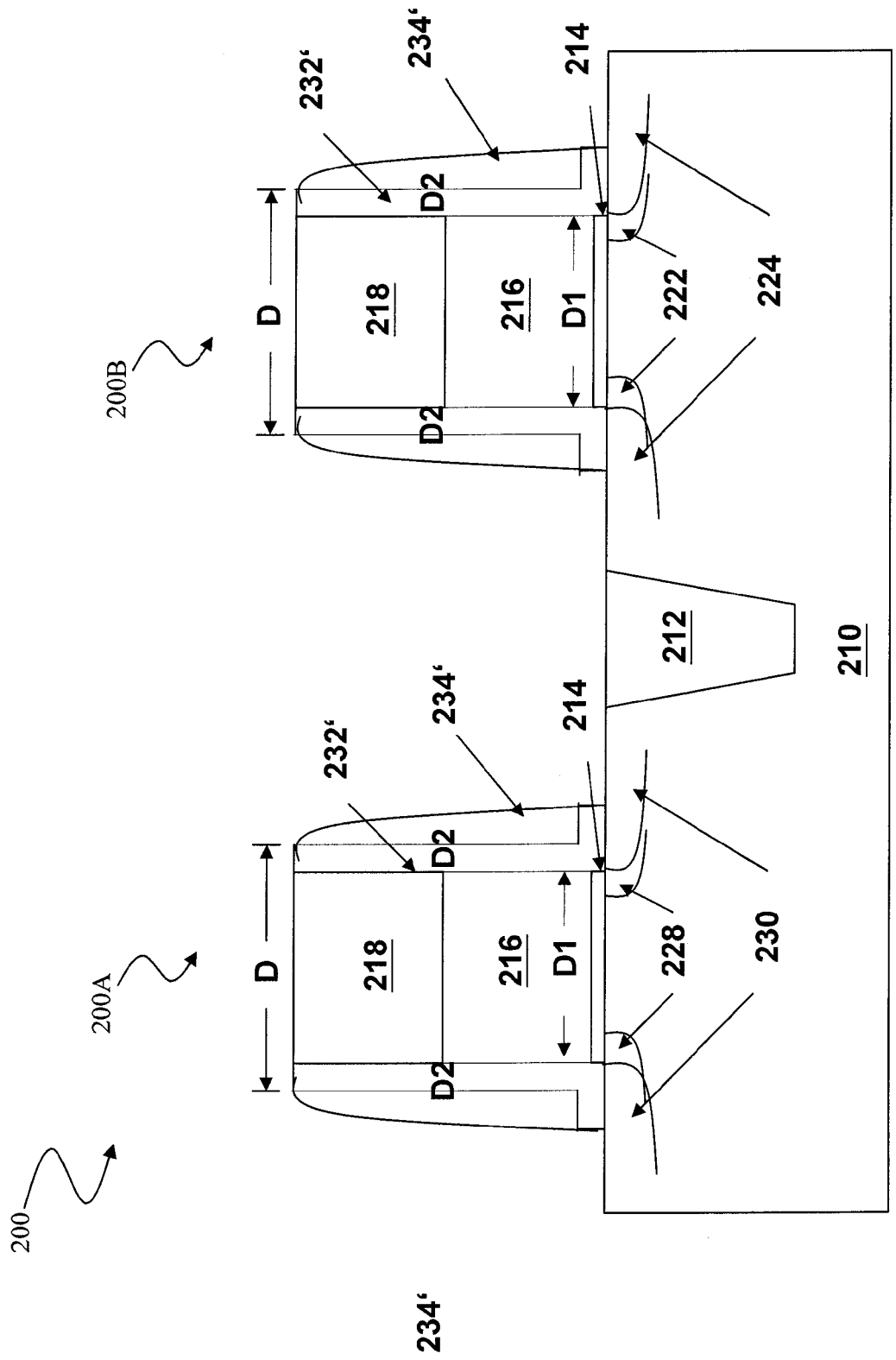

Referring to FIGS. 1 and 7, the method 100 continues with a step 108 in which L-shape spacers 232' and offset spacers 234' are formed by a patterning process. The L-shape spacers 232' have a vertical portion over the sidewalls of the PMOS/NMOS devices 200A/200B, and a horizontal portion over the substrate 210. The vertical portions of the L-shape spacers 232' have a width D2. The offset spacers 234' are over sidewalls of the L-shape spacers 232'. The patterning process may be performed by a wet etching process, a dry etching process, or a combination thereof. Preferably, the offset spacer layer 234 and the spacer layer 232 are patterned by a dry etching process and a wet etching process, respectively. In some embodiments, the dry etching process comprises a two-step etching process. During the patterning of the offset spacers 234', $CF_4$ and HBr are used in the first etching step and $CH_3F$ and $O_2$ are used in the second etching step. The spacer layer 232 is, then, etched by a wet etching process, e.g., diluted HF, to form the L-shape spacers 232'. As noted above, the gate structures have the line width D1 narrower than the target width D of the final gate structures for improving the shadowing effects during formation of the NLDD/P-type pocket regions 220/222 and the PLDD/N-type pocket regions 226/228. After completing the formation of the NLDD/P-type pocket regions 220/222 and the PLDD/N-type pocket regions 226/228, the width D2 and the width D1 form the target width D.

Figure 8:
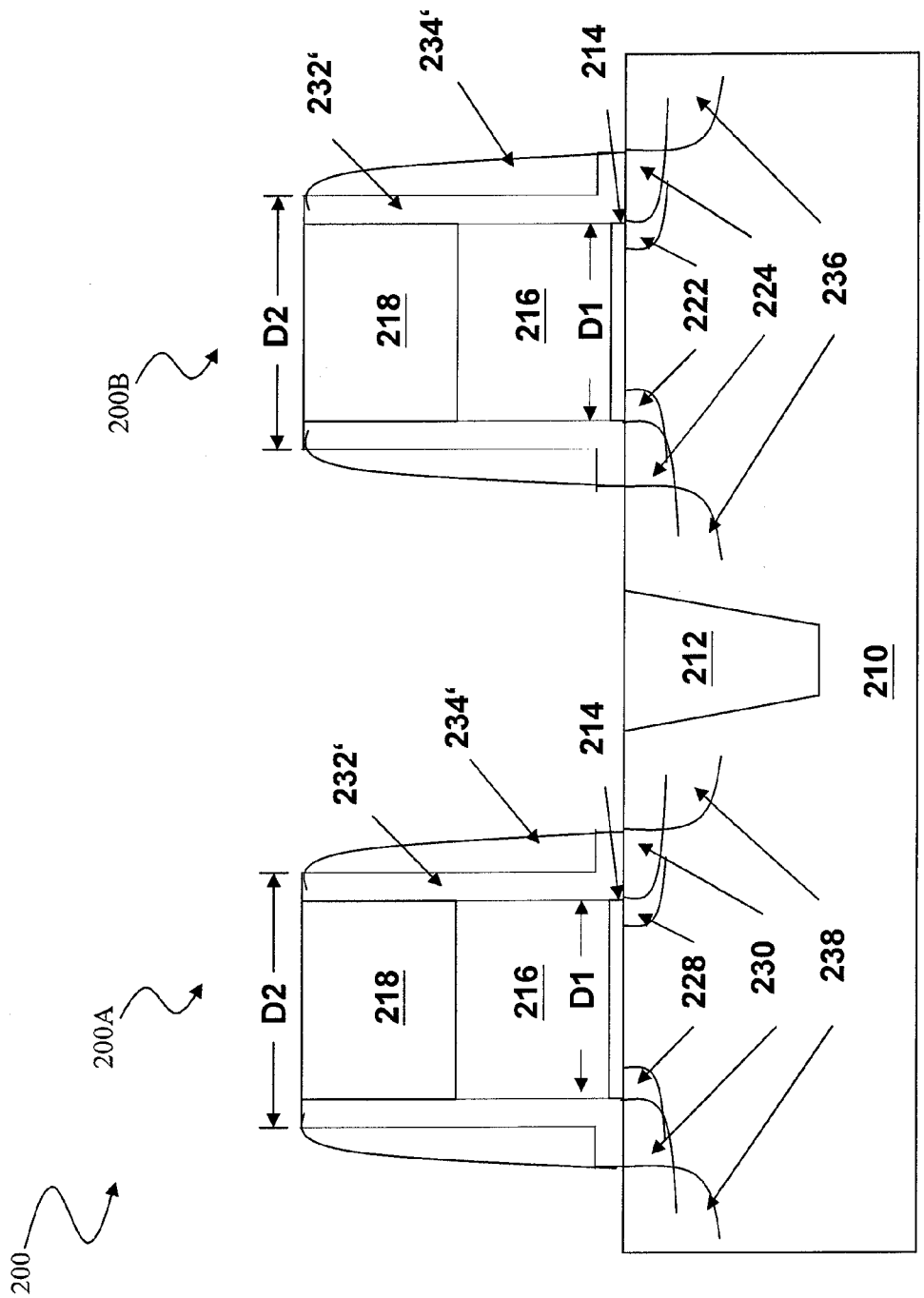

Referring to FIG. 8, source/drain (S/D) regions 238/236 may be formed in the substrate 210 for the NMOS/PMOS devices 200B/200A, respectively, by an implantation process. One or more contact features (not shown), such as silicide regions, may also be formed by any suitable process on the S/D regions.

Figure 9:
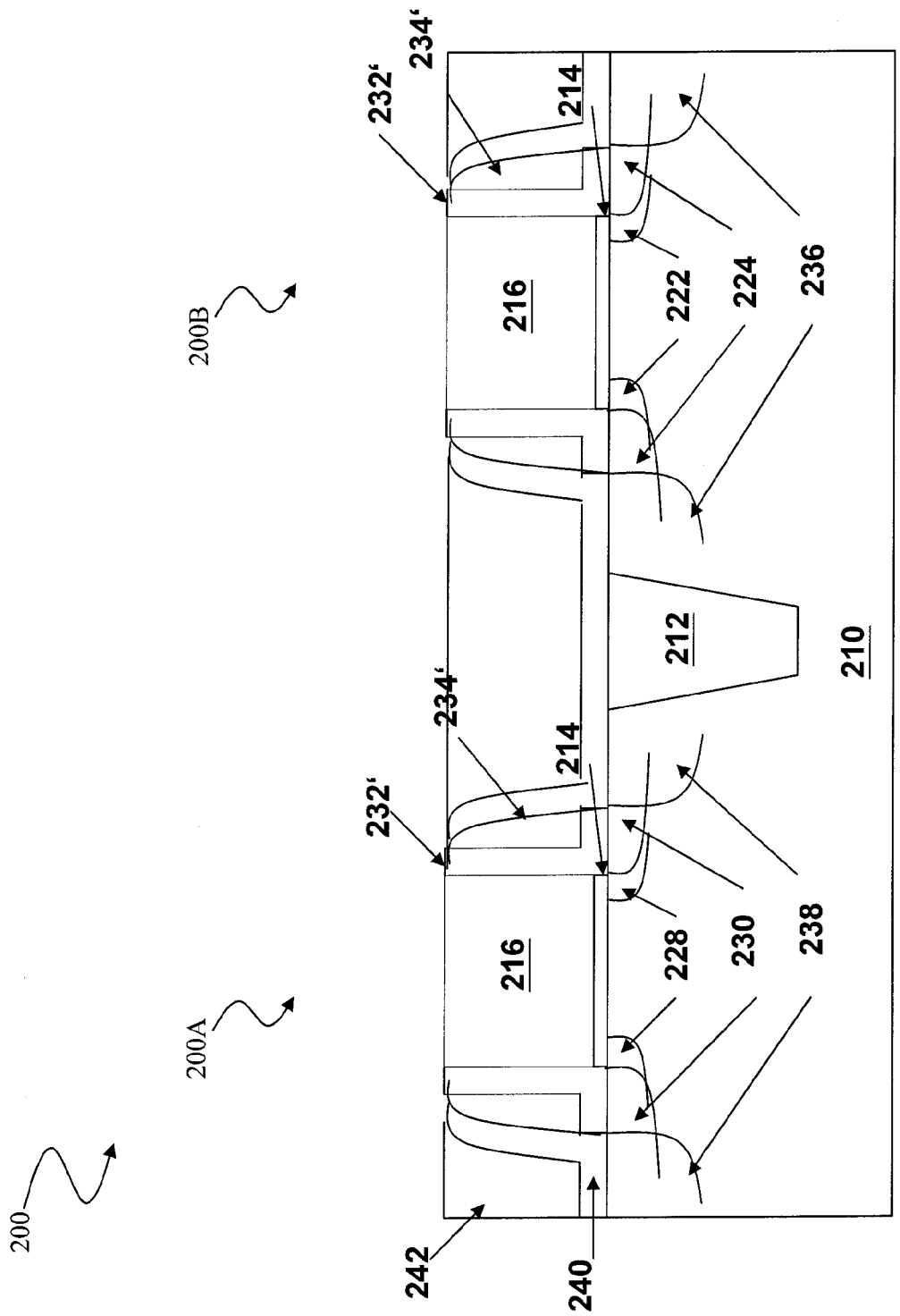

Referring to FIG. 9, a contact etch stop layer 240 is formed overlying sidewalls of the offset spacers 234', top surface of the hard mask 218, and the substrate 210. Then, an insulating inter-layer dielectric (ILD) 242 is formed overlying the contact etch stop layer 240. The contact etch stop layer 240, for example, has a composition including Si, N, and O. In some embodiments, the contact etch stop layer 240 has a thickness ranging between about 50 Å and about 200 Å. The ILD 240, for example, comprises Si and O. In some embodiments, the ILD 240 has a thickness ranging between about 1000 Å and about 5000 Å. In some embodiments, a planarizing process is then provided to the substrate 210. The planarizing process may comprise chemical mechanical polishing (CMP) to remove the hard mask 218 to expose top surface of the gate electrode 216. The contact etch stop layer 240, the ILD 242, the offset spacers 234', and the L-shape spacers 232' may be partially removed during the planarizing process as shown in the FIG. 9.

Figure 10:
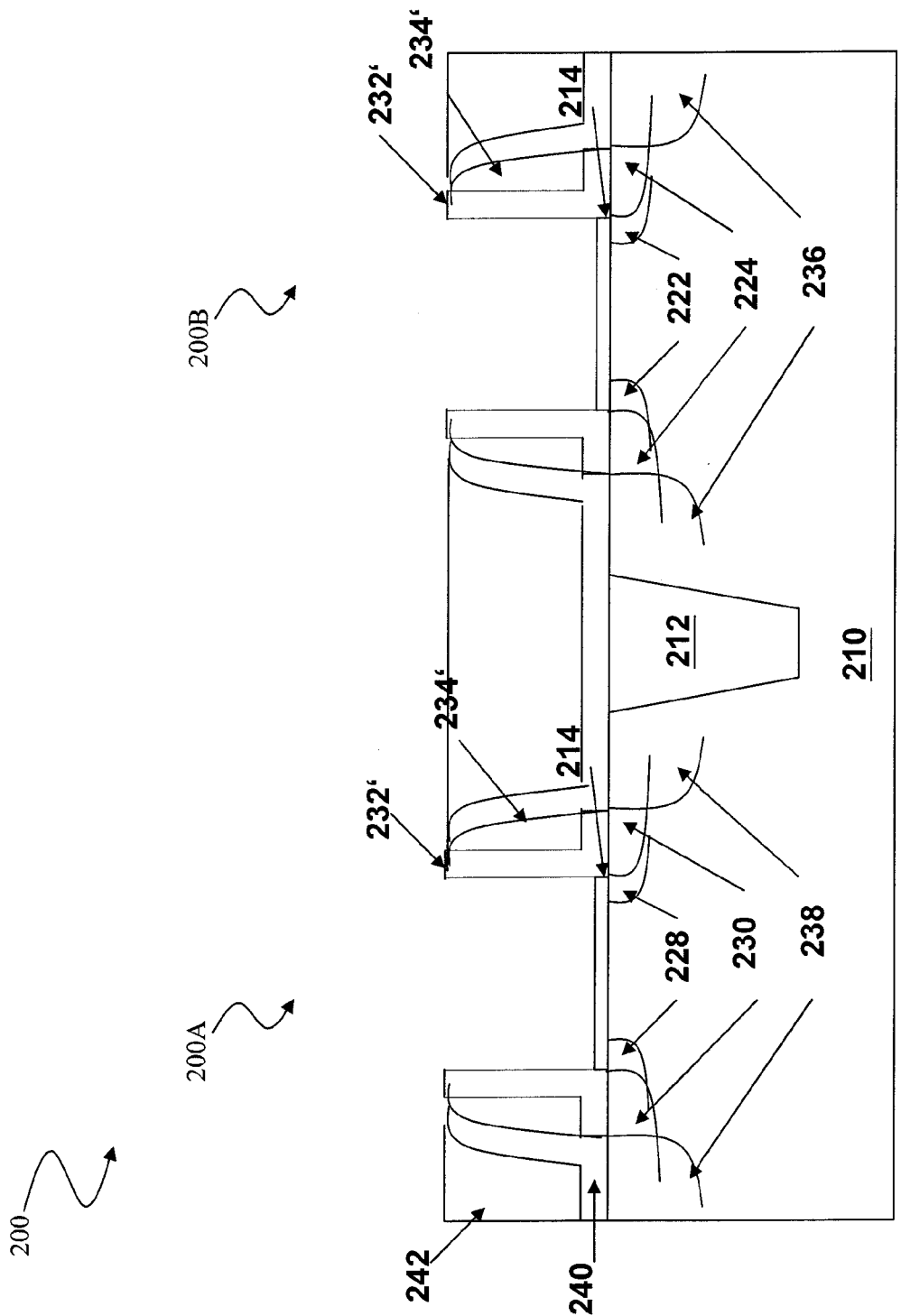
Figure 11:
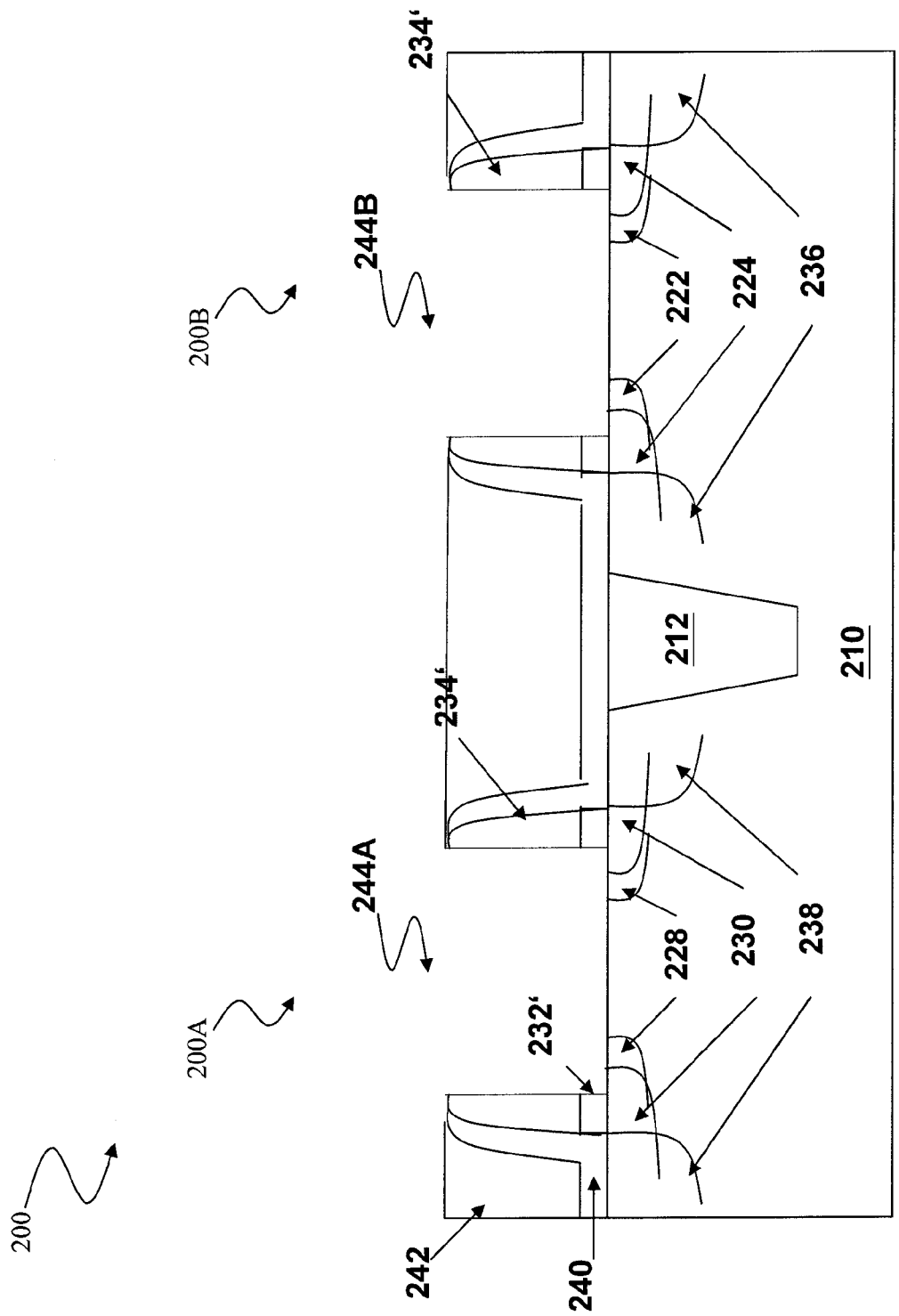

Referring to FIGS. 10 and 11, a gate replacement process is implemented to the gate structures 200A/200B. A first-step of the gate replacement process is to remove the gate electrode 216 by using a dry and/or a wet etching process as shown in FIG. 10. A second-step of a gate replacement process is to remove the gate dielectric 214 by using a dry and/or a wet etching process. In some embodiments, the vertical portions of the L-shape spacers 232' may be removed as well during the second-step of the gate replacement process to form trenches 244A and 244B with the width D.

Figure 12:
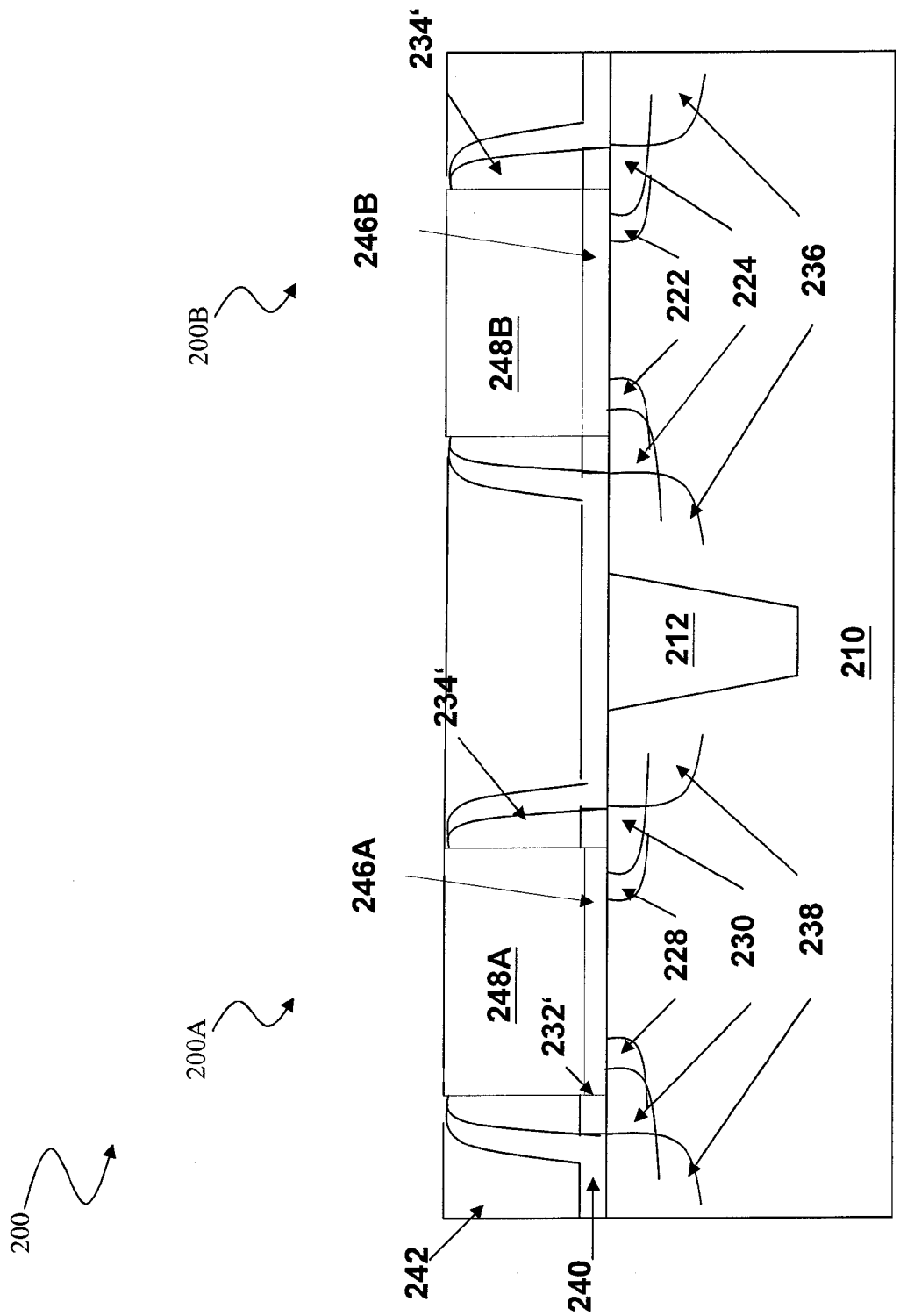

Referring to FIG. 12, high-K dielectrics 246B/246A and metal gates 248B/248A may be formed in the trenches 244B and 244A by formation processes. The metal gate 248B has a first work function for the gate structure of the NMOS devices 200B and the metal gate 248A has a second work function for the gate structure of the PMOS devices 200A. The metal gates 248B/248A may comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit device, the method comprising:
   providing a substrate;
   forming a gate stack overlying the substrate, wherein the gate stack comprises a gate electrode overlying a gate dielectric;
   forming lightly doped source/drain (LDD) regions in the substrate;
   thereafter forming a composite spacer overlying a sidewall of the gate stack, wherein the composite spacer comprises a first spacer and a second spacer, and the first spacer is positioned between the second spacer and the gate stack;
   removing the gate electrode to expose the gate dielectric and to form a trench; and
   enlarging a width of the trench by removing the gate dielectric and at least a substantial portion of the first spacer.

2. The method of claim 1, wherein the first spacer is a L-shape spacer with a vertical portion overlying the sidewall of the gate stack and a horizontal portion overlying the substrate.

3. The method of claim 2, wherein the removing at least a portion of the first spacer includes removing the vertical portion, but not removing the horizontal portion.

4. The method of claim 1 further comprising removing the gate dielectric.

5. The method of claim 1, wherein the gate electrode is polysilicon.

6. The method of claim 1, wherein the gate dielectric is silicon oxide.

7. The method of claim 1, wherein first spacer comprises a material that is the same as a material of the gate dielectric.

8. The method of claim 1, wherein the first spacer comprises a material different from a material of the second spacer.

9. The method of claim 1, wherein the second spacer is silicon nitride, silicon carbide, silicon oxynitride, silicon nitride carbide, or combinations thereof.

10. The method of claim 1, wherein the first spacer has a thickness ranging from 10 Angstroms (Å) to about 50 Å.

11. The method of claim 1, wherein the second spacer has a thickness ranging from 40 Å to about 300 Å.

12. The method of claim 1, wherein the step of forming the first spacer and the second spacer comprises:
    forming a second spacer layer over a first spacer layer; and
    patterning the second spacer and the first spacer layer using a dry etching process and a wet etching process, respectively.

13. The method of claim 1, further comprising:
    forming a metal gate after the step of removing at least a portion of the first spacer.

14. A method of fabricating an integrated circuit device, the method comprising:
    forming a sacrificial gate stack overlying a substrate, wherein the sacrificial gate stack comprises a sacrificial gate electrode overlying a sacrificial gate dielectric;
    forming lightly doped source/drain (LDD) regions in the substrate;

forming a first spacer layer overlying the sacrificial gate stack and the substrate;

forming a second spacer layer overlying the first spacer layer;

patterning the first and the second spacer layers to form L-shape spacers overlying sidewalls of the sacrificial gate stack, and offset spacers overlying sidewalls of the L-shape spacers;

forming an insulating layer overlying the offset spacers and the substrate; and removing the sacrificial gate stack and removing at least a substantial portion of the L-shape spacers to form a trench in the insulating layer, and a width of the trench being greater than a width of the sacrificial gate stack.

15. The method of claim 14, wherein the L-shape spacers have a thickness ranging from 10 Angstroms (Å) to about 50 Å.

16. The method of claim 14, wherein the offset spacers have a thickness ranging from 40 Å to about 300 Å.

17. The method of claim 14, further comprising:
forming a metal gate electrode in the trench.

18. The method of claim 17, wherein the metal gate electrode has a width larger than the width of the sacrificial gate electrode.

19. A method of fabricating an integrated circuit device, the method comprising:

providing a substrate;

forming a sacrificial gate dielectric layer overlying the substrate;

forming a sacrificial gate electrode layer overlying the sacrificial gate dielectric layer;

forming a hard mask pattern overlying the sacrificial gate electrode layer;

patterning the sacrificial gate electrode layer and the sacrificial gate dielectric to form a sacrificial gate stack by using the hard mask pattern as an etching mask;

forming a first spacer layer overlying the sacrificial gate stack and the substrate;

forming a second spacer layer overlying the first spacer layer;

patterning the first and the second spacer layers to form L-shape spacers overlying sidewalls of the sacrificial gate stack and offset spacers overlying the sidewalls of L-shape spacers;

forming a contact etch stop layer overlying the offset spacers and the substrate;

forming an insulating layer overlying the contact etch stop layer;

performing a planarization process to remove the hard mask pattern;

removing the sacrificial gate stack and removing at least a substantial portion of the L-shape spacers to form a trench in the insulating layer, and a width of the trench being greater than a width of the sacrificial gate stack; and forming a metal gate electrode in the trench.

20. The method of claim 19, wherein the planarization process is chemical mechanical polishing (CMP).

* * * * *